United States Patent [19]
Coots et al.

[11] Patent Number: 5,456,510
[45] Date of Patent: Oct. 10, 1995

[54] VACUUM NOZZLE WITH A PUSH-OFF DEVICE

[75] Inventors: Charles A. Coots, Endicott; John E. Danek, Vestal, both of N.Y.

[73] Assignee: Universal Instruments Corporation, Binghamton, N.Y.

[21] Appl. No.: 238,752

[22] Filed: Apr. 28, 1994

[51] Int. Cl.$^6$ .................................................. B66C 1/02
[52] U.S. Cl. ................................. 294/64.1; 901/40
[58] Field of Search ................. 294/2, 64.1, 65, 294/65.5; 901/40; 414/627, 737; 29/743

[56] References Cited

U.S. PATENT DOCUMENTS

| | | | |
|---|---|---|---|
| 4,850,780 | 7/1989 | Safabakhsh et al. | 294/64.1 X |
| 5,156,387 | 10/1992 | Seto | 294/64.1 X |
| 5,385,441 | 1/1995 | Swapp et al. | 901/40 X |

FOREIGN PATENT DOCUMENTS

| | | | |
|---|---|---|---|
| 3325207 | 1/1985 | Germany | 294/64.1 |
| 203193 | 8/1989 | Japan | 294/64.1 |
| 163735 | 7/1964 | U.S.S.R. | 294/64.1 |
| 307036 | 6/1971 | U.S.S.R. | 294/64.1 |

OTHER PUBLICATIONS

Western Electric Technical Digest No. 22, Apr. 1971.

*Primary Examiner*—Dean Kramer
*Attorney, Agent, or Firm*—Banner & Allegretti, Ltd.

[57] ABSTRACT

An apparatus including a vacuum nozzle including an elongated inner bore that defines an elongated vacuum conduit that is coaxial with the inner bore; a nozzle tip connected to the end of the vacuum nozzle and adjacent the vacuum conduit; a reciprocally movable sleeve located within the vacuum conduit and retained by the vacuum nozzle and extendable beyond the nozzle tip; and structure for applying a restorative force to the movable sleeve, the structure for applying a restorative force to the movable sleeve being located within the vacuum conduit and in contact with the movable sleeve.

20 Claims, 1 Drawing Sheet

VACUUM NOZZLE WITH A PUSH-OFF DEVICE

FIELD OF THE INVENTION

The present invention relates to a vacuum nozzle. More particularly, the present invention relates to a vacuum nozzle with a push-off device.

BACKGROUND OF THE INVENTION

A conventional pick and place robot is typically provided with a vacuum spindle. For example, U.S. Pat. No. 4,135,630, the entire contents of which is hereby expressly incorporated by reference, describes a vacuum spindle with a tubular vacuum nozzle. U.S. Pat. No. 4,838,452, the entire contents of which is hereby expressly incorporated by reference, describes a vacuum spindle with a vacuum nozzle having an cylindrically expanded lower surface. U.S. Pat. No. 5,105,528, the entire contents of which is hereby expressly incorporated by reference, describes apparatus for automatically interchanging vacuum nozzles on a vacuum spindle. U.S. Pat. No. 5,201,696, the entire contents of which is hereby expressly incorporated by reference, describes apparatus for automatically interchanging vacuum nozzles on a vacuum spindle with vacuum seals located between the vacuum spindle and the interchangeable nozzles. U.S. Pat. No. 5,285,888, the entire contents of which is hereby expressly incorporated by reference, describes apparatus for the control of the movement of a vacuum nozzle. U.S. Pat. No. 5,285,946, the entire contents of which is hereby expressly incorporated by reference, describes a vacuum nozzle having a strain gauge.

A suction cup or O-ring type of compliant rubber substance is conventionally provided on the bottom of the nozzle to help hold a part by vacuum that is to be placed on a circuit board during a pick and place process. A problem with these compliant devices is undesirable lifting or shifting of the part in relation to the circuit board after it has been placed on the circuit board. This disadvantageous lifting or shifting of the placed part can happen when the compliant material on the nozzle tip is of a low durometer hardness. On the other hand, a low durometer hardness nozzle tip is desirable in order to be able to pick parts out of a feeder by vacuum when the top surface of the parts are not parallel to the bottom surface of the tip or having a rough or uneven top surface.

Previously, it was attempted to solve this problem by providing an air kiss over-pressure on the top of the component while simultaneously removing the nozzle slowly away from the component. The disadvantage with this approach is that it slows down the production rate of the machine and the air kiss itself may cause shifting of components.

SUMMARY OF THE INVENTION

The present invention is directed to providing an apparatus comprising: a vacuum nozzle comprising an elongated inner bore that defines an elongated vacuum conduit that is coaxial with the inner bore; a nozzle tip connected to the end of the vacuum nozzle and adjacent the vacuum conduit; a reciprocally movable sleeve located within the vacuum conduit, retained by the vacuum nozzle and extendable beyond the nozzle tip; and means for applying a restorative force to the movable sleeve, said means for applying a restorative force to the movable sleeve being located within the vacuum conduit.

A principle object of the invention is to provide an apparatus for placing components that have a tendency of adhering to a compliant vacuum nozzle tip or shifting from a desired location when the nozzle tip is lifted away from the component after placement of the component.

Other objects, advantages and features of the present invention will be more readily appreciated and understood when considered in conjunction with the following detailed description and drawings.

BRIEF DESCRIPTION OF THE DRAWINGS

These and other aspects of the invention are apparent from the purely exemplary, and therefore not restrictive, embodiment illustrated in the following drawings, in which.

DESCRIPTION OF THE PREFERRED EMBODIMENTS

Figure 1:
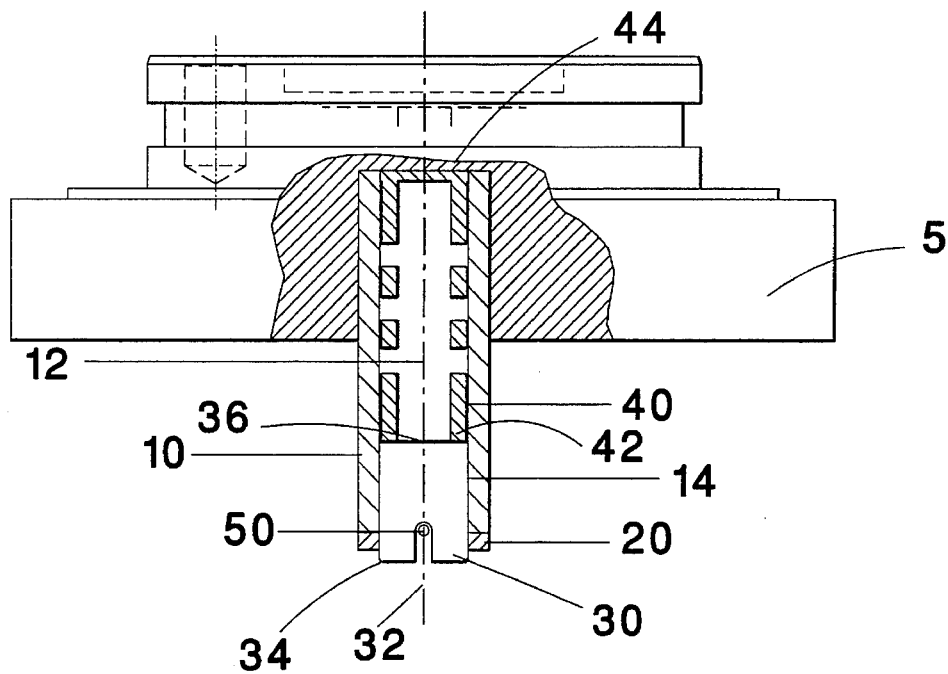
FIG. 1 illustrates a sectional view of a vacuum nozzle according to the present invention.

All the disclosed embodiments can be made using conventional compounds and procedures without undue experimentation. All the disclosed embodiments are useful. The invention and various advantageous details thereof are explained more fully below with reference to exemplary embodiments and with the aid of the drawings.

Referring to the drawings, it can be seen that this device uses a vacuum nozzle that has a nozzle tip and a reciprocally movable sleeve inside an elongated vacuum conduit whose movement is guided by the inner bore of the nozzle. The nozzle tip is advantageously made of a low durometer hardness resilient material that provides a good seal to the top surface of a component when a vacuum is applied.

Referring to FIG. 1, vacuum nozzle 10, as disclosed in U.S. Pat. No. 4,838,452, connected to nozzle body 5 is advantageously a metallic tube defining an elongated vacuum conduit 12. Vacuum conduit 12 has an elongated inner bore 14. Nozzle tip 20 is located at the end of nozzle 10 and can made of a material comprising urethane.

Figure 2:
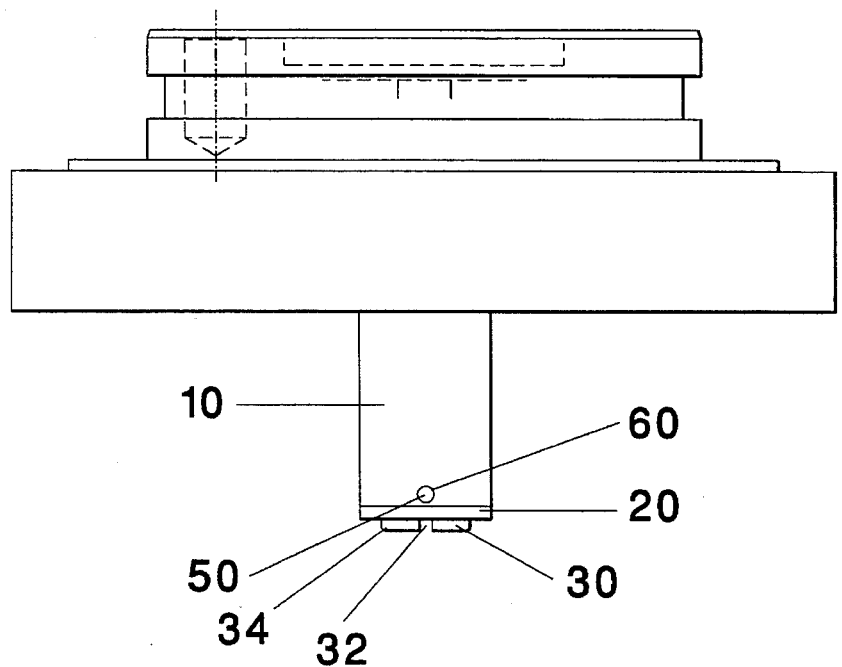
FIG. 2 illustrates a side elevation of the vacuum nozzle shown in FIG. 1.

Movable sleeve 30 is located within the vacuum conduit 12 and sleeve 30 is reciprocally movable and extendable beyond nozzle tip 20. Movable sleeve 30 is provided with a retaining pin recess 32 and sleeve 30 is constructed of a material that has a low coefficient of friction in relation to the material from which the vacuum nozzle 10 is made. As is apparent from FIG. 1, movable sleeve 30 includes an outer end 34 and an inner end 36. As described herein, sleeve 30 is movable between an extended position, wherein outer end 34 protrudes out nozzle tip 20, as shown in FIGS. 1 and 2, and a retracted position not shown, wherein outer end 34 is substantially flush with nozzle tip 20. As is apparent from the description hereinafter, movable sleeve 30 necessarily includes at least one passage extending between inner end 36 and outer end 34 so that vacuum conduit 12 is in fluid communication with a surface on an article held against nozzle tip 20.

Movable sleeve 30 is in contact to a means for applying a restorative force 40. Means for applying a restorative force 40 forces sleeve 30 to extend beyond nozzle tip 20. As is apparent from FIG. 1, the means for applying a restorative force 40 includes a first end 42 and a second end 44, with second end 42 being distally located with respect to nozzle tip 20. More specifically, the first end 42 of the means for applying a restorative force 40 contacts inner end 36 of movable sleeve 30 and second end 44 of the means for applying a restorative force 40 is restrained inside nozzle 10. Thus, the means for applying a restorative force 40 biases movable sleeve 30 into its extended position Means for applying a restorative force 40 is typically a steel coil spring, a polymeric sponge or the equivalents thereof.

Referring to FIG. 2, retaining pin 50 passes through holes 60 which are substantially perpendicular to the centerline of bore 14 in nozzle 10 and through retaining pin recess 32 in movable sleeve 30. The depth of the retaining pin recess 32 is cut to provide the desired length of protrusion of the sleeve 30 beyond the bottom of the nozzle tip 20.

A method of pick-and-place operation of an embodiment according to the present invention will now be described.

Prior to a pick cycle, sleeve 30 is biased into its extended position by the means for applying a restorative force 40. During a pick cycle, the nozzle body 5 carrying the vacuum nozzle 10 moves down to pick a component, not shown, from a feeder, not shown. Outer end 34 of movable sleeve 30 contacts the component, and the component resists the further downward movement of movable sleeve 30 as vacuum nozzle 10 continues to move downward, to push sleeve 30 up inside vacuum nozzle 10 and compress spring 40. When the nozzle tip 20 is seated on the component, and the vacuum is applied, the component is held against the nozzle tip 20 while means for applying a restorative force 40 remains in a state of compression due to the application of the vacuum and the seal created between the component and the nozzle tip 20. The nozzle body 5 and the nozzle 10 can then be displaced upwards to lift the component out of the feeder.

During the place cycle, the nozzle tip 20 places the part on a circuit board, not shown. The vacuum is turned off, nozzle tip 20 is lifted away from the component and the means for applying a restorative force 40 acts so as to cause sleeve 30 to protrude from the nozzle tip 20 so as to force the separation of the component from nozzle tip 20.

The foregoing description of a preferred embodiment is provided by way of illustration. Practice of the present invention is not limited thereto and variations therefrom will be readily apparent to the skilled artisan without deviating from the spirit of the present invention.

While there is shown and described herein certain specific combinations embodying this invention for the purpose of clarity of understanding, the same is to be considered as illustrative in character, it being understood that only preferred embodiments have been shown and described. It will be manifest to those skilled in the art that certain changes, various modifications and rearrangements of the parts may be made without departing from the spirit and scope of the underlying inventive concept and that the same is not limited to the particular forms herein shown and described except insofar as indicated in the scope of the appended claims.

The entirety of everything cited above or below is expressly incorporated herein by reference.

What is claimed is:

1. A vacuum pickup device comprising:

a vacuum nozzle comprising an elongated inner bore that defines an elongated vacuum conduit that is coaxial with the inner bore;

a nozzle tip connected to the end of the vacuum nozzle and adjacent the vacuum conduit;

a reciprocally movable sleeve located within the vacuum conduit, retained by the vacuum nozzle and extendable beyond the nozzle tip;

means for applying a restorative force to the reciprocally movable sleeve, said means for applying a restorative force to the reciprocally movable sleeve being located within the vacuum conduit and in contact with the movable sleeve; and a retaining pin connected to the vacuum nozzle;

wherein the vacuum nozzle further comprises a pair of coaxial retaining pin holes through which the retaining pin passes such that the retaining pin is substantially perpendicular to the axis of the vacuum conduit and the reciprocally movable sleeve comprises a retaining pin recess formed in an end of the sleeve through which the retaining pin passes.

2. The device of claim 1 wherein the means for applying a restorative force to the reciprocally movable sleeve comprises a coil spring.

3. The device of claim 2 wherein said reciprocally movable sleeve includes a first end which is extendable beyond the nozzle tip and a second end opposite said first end, said coil spring including a first end distally located from said nozzle tip and a second end opposite said first end of said coil spring, said second end of said coil spring contacting said second end of the movable sleeve and biasing the first end of the movable sleeve towards a position extending beyond the nozzle tip.

4. The device of claim 1 wherein the nozzle tip is made of a material comprising urethane.

5. The device of claim 1 wherein said movable sleeve includes a front end, said movable sleeve being movable between an extended position in which said front end of the movable sleeve extends beyond the nozzle tip, and a retracted position in which said front end of the movable sleeve is substantially flush with the nozzle tip, and said movable sleeve is held in its retracted position against a force applied by said means for applying a restorative force by the application of a vacuum to the vacuum conduit and a seal created between the nozzle tip and an article to be lifted.

6. The device of claim 1 wherein said nozzle tip contacts an article to be lifted and creates a seal thereagainst, and said reciprocally movable sleeve permits the passage of air therethrough for fluidly connecting the vacuum conduit with the article against the nozzle tip.

7. A vacuum pickup device for picking up an article, the vacuum pickup device comprising:

a vacuum nozzle comprising an elongated inner bore that defines an elongated vacuum conduit that is coaxial with the inner bore;

a nozzle tip connected to the end of the vacuum nozzle and adjacent the vacuum conduit;

a reciprocally movable member located within the inner bore and retained by the vacuum nozzle, said movable member including a front end, and being movable between an extended position in which said front end of the movable member extends beyond the nozzle tip, and a retracted position in which said front end of the movable member is substantially flush with the nozzle tip; and a biasing device providing a force to bias the reciprocally movable member towards its extended position, said biasing device being located within the inner bore and in contact with the movable member;

wherein said movable member is held in its retracted position against the force applied by the biasing device by the application of a vacuum to the vacuum conduit and a seal created between the nozzle tip and the article to be lifted.

8. The device of claim 7 further comprising a retaining pin connected to the vacuum nozzle, wherein the vacuum nozzle further comprises a pair of coaxial retaining pin holes through which the retaining pin passes such that the retaining pin is substantially perpendicular to the axis of the vacuum conduit and the reciprocally movable member comprises a retaining pin recess formed in an end of the member through which the retaining pin passes.

9. The device of claim 7 wherein the biasing device comprises a coil spring.

10. The device of claim 9 wherein the reciprocally movable member includes a first end which is extendable beyond the nozzle tip and a second end opposite said first end, said coil spring including a first end distally located from said nozzle tip and a second end opposite said first end, said second end of said coil spring contacting said second end of the movable member to bias the reciprocally movable member towards its extended position.

11. The device of claim 9 wherein the nozzle tip is made of a material comprising urethane.

12. The device of claim 7 wherein said reciprocally movable member permits the passage of air therethrough for fluidly connecting the vacuum conduit with the article sealed against the nozzle tip.

13. The device of claim 7 further comprising a retainer member connected to the vacuum nozzle, said retainer member retaining the reciprocally movable member within the vacuum nozzle.

14. A vacuum pickup device for picking up an article, the vacuum pickup device comprising:

a vacuum nozzle comprising an elongated inner bore that defines an elongated vacuum conduit that is coaxial with the inner bore;

a nozzle tip connected to the end of the vacuum nozzle for contacting the article to be lifted and creating a seal thereagainst;

a reciprocally movable member located within the inner bore, retained by the vacuum nozzle and extendable beyond the nozzle tip, said movable member permitting the passage of air therethrough for fluidly connecting the vacuum conduit with the article against the nozzle tip; and a restorative force device for moving the reciprocally movable member, said restorative force device being located within the inner bore and in physical contact with the movable member.

15. The device of claim 14 further comprising a retaining pin connected to the vacuum nozzle, wherein the vacuum nozzle further comprises a pair of coaxial retaining pin holes through which the retaining pin passes such that the retaining pin is substantially perpendicular to the axis of the vacuum conduit and the reciprocally movable member comprises a retaining pin recess formed in an end of the member through which the retaining pin passes.

16. The device of claim 14 wherein said restorative force device comprises a coil spring.

17. The device of claim 16 wherein the reciprocally movable member includes a first end which is extendable beyond the nozzle tip and a second end opposite said first end, said coil spring including a first end distally located from said nozzle tip and a second end opposite said first end, said second end of said coil spring contacting said second end of the movable member and biasing the first end of the movable sleeve towards a position extending beyond the nozzle tip.

18. The device of claim 17 wherein the nozzle tip is made of a material comprising urethane.

19. The device of claim 16 wherein said movable member includes a front end, said movable member being movable between an extended position in which said front end of the movable member extends beyond the nozzle tip, and a retracted position in which said front end of the movable member is substantially flush with the nozzle tip, and said movable member is held in its retracted position against a force applied by said restorative force device by the application of a vacuum to the vacuum conduit and a seal created between the nozzle tip and an article to be lifted.

20. The device of claim 19 further comprising a retainer member connected to the vacuum nozzle, said retainer member retaining the reciprocally movable member within the vacuum nozzle.

* * * * *